(12) United States Patent
Zhang et al.

(10) Patent No.: US 10,192,903 B2
(45) Date of Patent: Jan. 29, 2019

(54) METHOD FOR MANUFACTURING TFT SUBSTRATE

(71) Applicant: Shenzhen China Star Optoelectronics Technology Co., Ltd., Shenzhen, Guangdong (CN)

(72) Inventors: Xiaoxing Zhang, Guangdong (CN); Xingyu Zhou, Guangdong (CN); Yuan Jun Hsu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/323,648

(22) PCT Filed: Sep. 28, 2016

(86) PCT No.: PCT/CN2016/100576
§ 371 (c)(1),
(2) Date: May 1, 2017

(87) PCT Pub. No.: WO2018/032579
PCT Pub. Date: Feb. 22, 2018

(65) Prior Publication Data
US 2018/0182786 A1 Jun. 28, 2018

(30) Foreign Application Priority Data
Aug. 17, 2016 (CN) .......................... 2016 1 0683532

(51) Int. Cl.
*H01L 27/12* (2006.01)
*H01L 21/02* (2006.01)
(Continued)

(52) U.S. Cl.
CPC ...... *H01L 27/1277* (2013.01); *H01L 21/0217* (2013.01); *H01L 21/02164* (2013.01); *H01L 21/02592* (2013.01); *H01L 21/02675* (2013.01); *H01L 21/26513* (2013.01); *H01L 21/31155* (2013.01); *H01L 21/77* (2013.01); *H01L 27/12* (2013.01); *H01L 27/1218* (2013.01); *H01L 27/1222* (2013.01); *H01L 27/1251* (2013.01); *H01L 27/3246* (2013.01); *H01L 27/3248* (2013.01); *H01L 27/3262* (2013.01); *H01L 29/167* (2013.01); *H01L 29/42364* (2013.01);
(Continued)

(58) Field of Classification Search
None
See application file for complete search history.

(56) References Cited

U.S. PATENT DOCUMENTS

2009/0146927 A1* 6/2009 Wan ..................... G09G 3/3225
345/76
2010/0193785 A1* 8/2010 Kimura ............... H01L 27/1214
257/43

* cited by examiner

*Primary Examiner* — Asok K Sarkar

(57) ABSTRACT

A method for manufacturing a TFT substrate is disclosed. The TFT substrate includes a drive TFT region and a display TFT region. The drive TFT region and the display TFT region are manufactured with different technologies, so that different requirements for TFT can be met. The manufacturing method according to the present disclosure mainly includes: forming a first amorphous silicon layer to obtain a drive TFT region; forming a second amorphous silicon layer to obtain a display TFT region; and then depositing a passivation layer and a flat layer, so that the TFT substrate is manufactured after following treatment steps.

9 Claims, 5 Drawing Sheets

(51) Int. Cl.
*H01L 21/77* (2017.01)
*H01L 21/265* (2006.01)
*H01L 21/3115* (2006.01)
*H01L 27/32* (2006.01)
*H01L 29/167* (2006.01)
*H01L 29/423* (2006.01)
*H01L 51/56* (2006.01)
H01L 29/66 (2006.01)
H01L 29/786 (2006.01)

(52) U.S. Cl.
CPC ........ *H01L 51/56* (2013.01); *H01L 21/02532* (2013.01); *H01L 21/02686* (2013.01); *H01L 29/66757* (2013.01); *H01L 29/66765* (2013.01); *H01L 29/78675* (2013.01); *H01L 29/78678* (2013.01); *H01L 2227/323* (2013.01)

METHOD FOR MANUFACTURING TFT SUBSTRATE

CROSS-REFERENCE TO RELATED APPLICATIONS

The present application claims the priority of Chinese patent application CN201610683532.9 entitled "Method for Manufacturing TFT Substrate" and filed on Aug. 17, 2016, the entirety of which is incorporated herein by reference.

TECHNICAL FIELD

The present disclosure relates to the technical field of display, and particularly to a method for manufacturing a TFT substrate.

TECHNICAL BACKGROUND

Low temperature polysilicon (LTPS) technology is a new generation of Thin Film Transistor (TFT) substrate manufacturing technology. Compared with conventional amorphous silicon (a-Si) technology, LTPS display device has advantages of high response speed, high brightness, high resolution, and low power consumption. Polysilicon (Poly-Si) has excellent electrical properties and has a good drive capability as to the active matrix organic light-emitting diodes (AMOLED). As a result, AMOLED display backplates based on LTPS polysilicon technology are widely used at present.

AMOLED display backplate manufacturing methods based on mere LTPS technology or oxide technology are methods currently used widely, and the AMOLED display backplate manufactured through the two technologies have good electrical properties and can have a very good drive capability. In addition, polysilicon prepared through Solid Phase Crystallization (SPC) method has good uniformity, low electric leakage, and better stability, and thus the SPC method has become a good method for manufacturing AMOLED backplate.

At present, LTPS is prepared through Excimer Laser Annealing (ELA) technology. According to ELA technology, instantaneous pulse of a laser irradiates on the surface of the amorphous silicon, so that the amorphous silicon can be melted and recrystallized. However, according to ELA crystallization technology, lattice uniformity and crystal orientation cannot be controlled effectively, and thus polysilicon cannot be formed on the whole substrate in a uniform manner. As a result, an image displayed by a display device manufactured thereby is non-uniform, and mura would appear. In addition, the display device would have a high electric leakage.

SUMMARY OF THE DISCLOSURE

Aimed at the above-mentioned technical problem in the prior art, the present disclosure provides a method for manufacturing a TFT substrate.

The present disclosure provides a method for manufacturing a TFT substrate, which comprises:

step 101: providing a substrate and depositing a buffer layer on the substrate, wherein the substrate includes a drive TFT region and a display TFT region;

step 102: depositing a first amorphous silicon layer on the buffer layer, and subjecting the first amorphous silicon layer to an excimer laser annealing scan (ELA scan) treatment, to convert the first amorphous silicon layer into a first polysilicon layer;

patterning the first polysilicon layer, to obtain a first active layer that is located in the drive TFT region;

step 103: depositing a gate insulating layer on the first active layer and the buffer layer;

depositing and patterning a first metal layer (M1 layer) on the gate insulating layer, to respectively form a first gate electrode at a place corresponding to position of the first active layer, as a top gate structure, and forming a second gate electrode at a place corresponding to position where the first active layer is not arranged, as a bottom gate structure;

step 104: implanting ions into the gate insulating layer, the first gate electrode and the second gate electrode being used as blocking layer;

step 105: then depositing an interlayer insulating layer on the gate insulating layer, the first gate electrode and the second gate electrode, and depositing a second amorphous silicon layer on the interlayer insulating layer, and then implanting ion into the second amorphous silicon layer, and later conducting solid phase crystallization (SPC) of the second amorphous silicon layer, to convert crystal of the second amorphous silicon layer into a second polysilicon layer;

patterning the second polysilicon layer, to form a second active layer at a place corresponding to position of the second gate electrode;

step 106: forming a first via hole and a second via hole on the gate insulating layer and the interlayer insulating layer corresponding to the first active layer, and forming a third via hole on the interlayer insulating layer corresponding to the second gate electrode;

step 107: depositing a source-drain electrode layer (M2 layer), and patterning the source-drain electrode layer, while forming a channel on the surface of the second active layer at the same time;

step 108: depositing a passivation layer and patterning the passivation layer, then depositing a flat layer on the passivation layer, forming a fourth via hole at position in the display TFT region on the flat layer, the forth via hole extending to surface of the source-drain electrode layer; and step 109: depositing an anode electrode on the flat layer, the anode electrode being in contact with the source-drain electrode layer via the fourth via hole, and then depositing a pixel definition layer, and carrying out pattern definition; then it completes manufacturing of TFT substrate.

Further, the substrate is a glass substrate.

Further, a material of the buffer layer is silicon oxide, silicon nitride, or a combination thereof.

Further, a thickness of the gate insulating layer ranges from 50 nm to 500 nm.

Preferably, the thickness of the gate insulating layer ranges from 100 nm to 200 nm.

Further, a material of the interlayer insulating layer is silicon oxide, silicon nitride or a combination thereof.

Further, a thickness of the interlayer insulating layer ranges from 100 nm to 300 nm.

The thickness of the interlayer insulating layer is preferably 200 nm.

Further, the second amorphous silicon layer is implanted with boron (B) ions.

Further, a thickness of the passivation layer ranges from 50 nm to 300 nm.

Preferably, the thickness of the passivation layer ranges from 100 nm to 200 nm.

Further, a thickness of the flat layer ranges from 100 nm to 500 nm.

Preferably, the thickness of the flat layer ranges from 200 nm to 300 nm.

Further, a thickness of the pixel definition layer ranges from 300 nm to 900 nm.

Preferably, the thickness of the pixel definition layer ranges from 400 nm to 500 nm.

The following beneficial effects can be brought about according to the present disclosure.

According to the present disclosure, the active layer of the drive TFT region and that of the display TFT region in the TFT substrate are manufactured through different technologies so that different requirements for TFT can be met. In the display TFT region, a short switching time and a small leakage current are needed, while in the drive TFT region, sufficient electron mobility and current output uniformity are needed so as to improve luminous uniformity thereof. According to the present disclosure, excimer laser annealing (ELA) is performed on the amorphous silicon layer of the drive TFT region so as to obtain LTPS TFT, and at the same time, solid phase crystallization (SPC) is performed on the amorphous silicon layer of the display TFT region so as to obtain SPC poly TFT. In this manner, different requirements of the display panel for the properties of TFT can be met. In the display TFT region, TFT of LTPS is used, so that its advantages of quick response and small volume can be played. In the drive TFT region, SPC poly TFT is used, so that OLED device with a constant current can be manufactured. The OLED device has a high mobility, a good reliability and a small parasitic capacitance. With the cooperation of the drive TFT region and the display TFT region, the technical problem of non-uniform picture can be solved, and power consumption thereof can be reduced. In this manner, not only the manufacturing cost can be saved, but also luminous uniformity of OLED can be improved.

The above-described technical features may be replaced by combination in various suitable ways or equivalent technical features, as long as the purpose of the present disclosure can be realized.

BRIEF DESCRIPTION OF THE DRAWINGS

The present disclosure will be described in more details hereinafter based on embodiments and with reference to the drawings. In the drawings.

Figure 1:
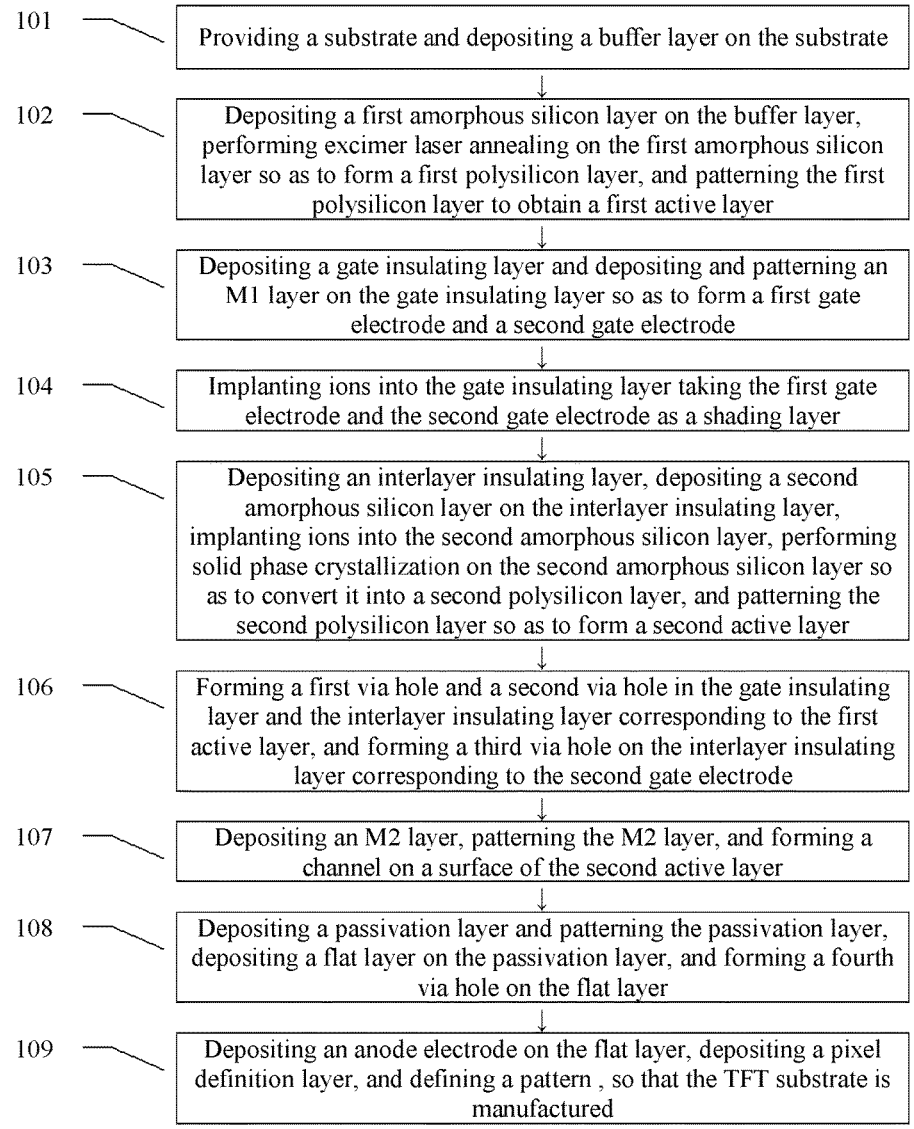
FIG. 1 is a flow chart of a method according to an embodiment of the present disclosure.

In the drawings, a same component is represented by a same reference sign. The drawings are not drawn according to actual scale.

DETAILED DESCRIPTION OF THE EMBODIMENTS

The technical solutions of the present disclosure will be described below in a clear and complete way in combination with the drawings. It is obvious that, the embodiments described herein are only some embodiments of the present disclosure rather than all the embodiments. Based on the embodiments disclosed herein, other embodiments that are obtained by one skilled in the art without creative work all fall into the protection scope of the present disclosure.

FIG. 1 is a flow chart of a method according to an embodiment of the present disclosure. The method for manufacturing a TFT substrate will be described in detail below with reference to FIG. 1.

In step 101, a substrate 1 is provided, and a buffer layer 2 is deposited on the substrate 1, wherein the substrate 1 includes a drive TFT region and a display TFT region.

Specifically, the substrate is a glass substrate.

Specifically, the buffer layer is deposited by physical vapor deposition, chemical vapor deposition, or plasma assisted chemical vapor deposition.

Figure 2:
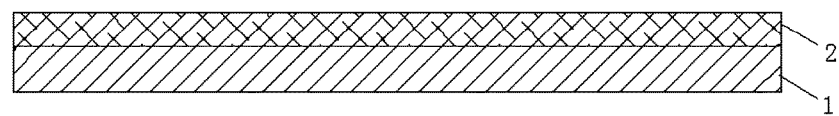
FIG. 2 schematically shows a step of depositing a buffer layer on a substrate according to an embodiment of the present disclosure.

FIG. 2 schematically shows a step of depositing a buffer layer on a substrate according to an embodiment of the present disclosure, wherein 1 is a substrate and 2 is a buffer layer.

In particular, the material of the buffer layer 2 is silicon oxide, silicon nitride, or a combination thereof.

Preferably, silicon oxide is used according to the present embodiment.

Next, in step 102, a first amorphous silicon layer 21 is deposited on the buffer layer 2, and excimer laser annealing is performed on the first amorphous silicon layer 21 so as to convert the first amorphous silicon layer into a first polysilicon layer through crystallization.

Figure 3:
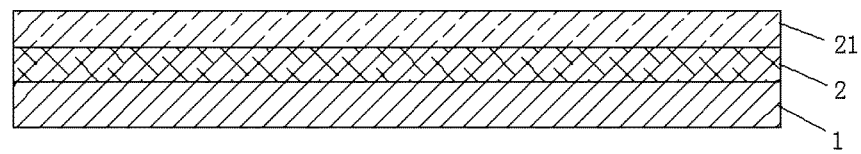
FIG. 3 schematically shows a step of depositing a first amorphous silicon layer on a buffer layer according to an embodiment of the present disclosure.

FIG. 3 schematically shows a step of depositing a first amorphous silicon layer on a buffer layer according to an embodiment of the present disclosure, wherein 1 is a substrate, 2 is a buffer layer, and 21 is a first amorphous silicon layer.

The first polysilicon layer is patterned, and thus a first active layer 3 located in the drive TFT region is obtained.

Figure 4:
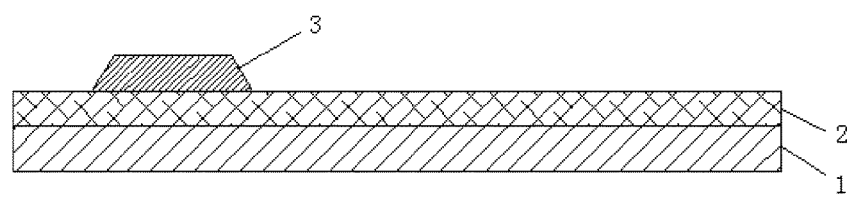
FIG. 4 schematically shows a step of forming a first active layer in the drive TFT region according to an embodiment of the present disclosure.

FIG. 4 schematically shows a step of forming a first active layer in a drive TFT region according to an embodiment of the present disclosure, wherein 1 is a substrate, 2 is a buffer layer, and 3 is a first active layer.

Specifically, the first amorphous silicon layer is deposited through the way of spin coating, printing or the like.

Excimer laser annealing is performed on the amorphous silicon layer to form the polysilicon layer. In this step, the amorphous silicon layer is melted and the silicon molecules therein are recrystallized, so that the polysilicon layer can be formed. The polysilicon layer serves as a material layer of the active layer.

In step 103, a gate insulating layer 4 is deposited on the first active layer 3 and the buffer layer 2.

A first metal layer (M1 layer) is deposited on the gate insulating layer 4 and patterned, so that a first gate electrode 51 can be formed at a position corresponding to position of the first active layer 3 to serve as a top-gate structure, and a second gate electrode 52 can be formed at a position corresponding to position where the active layer 3 is not arranged to serve as a bottom-gate structure.

Figure 5:
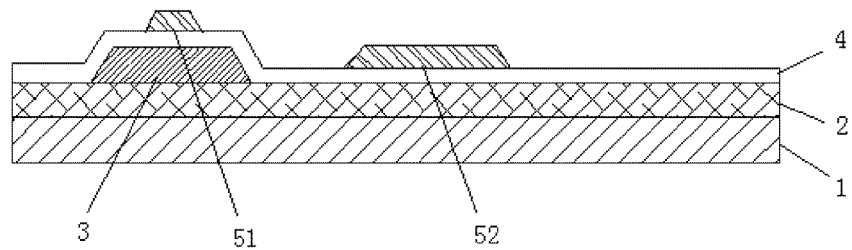
FIG. 5 schematically shows a step of depositing a gate insulating layer and a first metal layer on a first active layer and a buffer layer according to an embodiment of the present disclosure.

FIG. 5 schematically shows a step of depositing a gate insulating layer and a first metal layer on a first active layer and a buffer layer according to an embodiment of the present disclosure, wherein 1 is a substrate, 2 is a buffer layer, 3 is a first active layer, 4 a gate insulating layer, 51 a first gate electrode, and 52 a second gate electrode.

Specifically, the gate insulating layer is deposited through the ways of spin coating, printing or others.

The gate insulating layer is an inorganic insulating layer or an organic insulating layer. The inorganic insulating layer is silicon dioxide, silicon nitride, and the like. The organic insulating layer is polyvinylpyrrolidone, polyimide, propylene, and the like.

In particular, a plasma treatment can be performed on the surface of the gate insulating layer so as to repair defects on the surface thereof.

In step 104, ions are implanted into the gate insulating layer 4 taking the first gate electrode 51 and the second gate electrode 52 as a shading layer.

Figure 6:
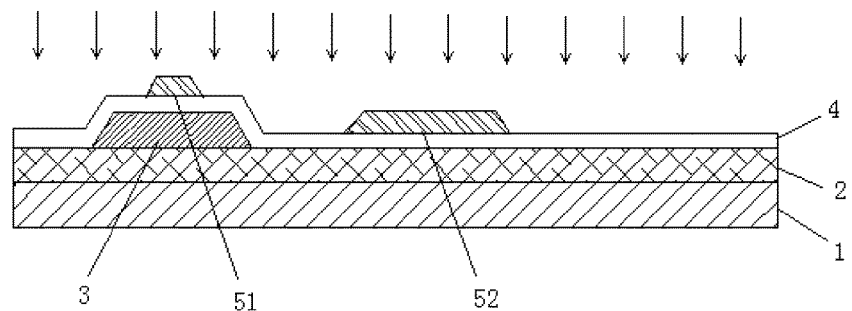
FIG. 6 schematically shows a step of implanting ions into a gate insulating layer according to an embodiment of the present disclosure.

FIG. 6 schematically shows a step of implanting ions into a gate insulating layer according to an embodiment of the present disclosure, wherein 1 is a substrate, 2 is a buffer layer, 3 is a first active layer, 4 is a gate insulating layer, 51 is a first gate electrode, and 52 is a second gate electrode.

In step 105, an interlayer insulating layer 6 is deposited on the gate insulating layer 4, the first gate electrode 51 and the second gate electrode 52, and a second amorphous silicon layer 61 is deposited on the interlayer insulating layer 6, ions are implanted into the second amorphous silicon layer 61, and solid phase crystallization (SPC) is performed on the second amorphous silicon layer 61, thereby converting the second amorphous silicon layer into a second polysilicon layer through crystallization.

Figure 7:
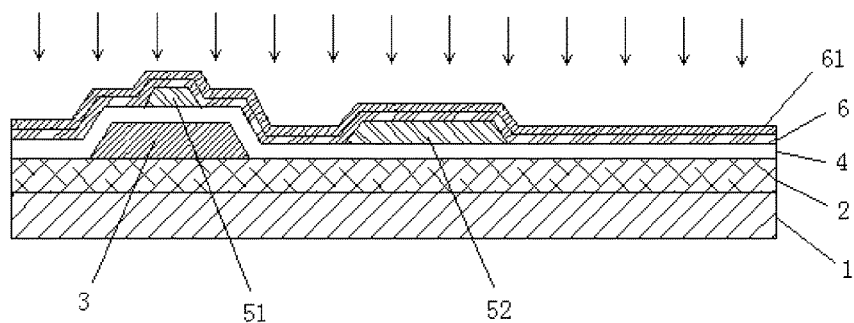
FIG. 7 schematically shows a step of depositing an interlayer insulating layer and a second amorphous silicon layer on the gate insulating layer, the first gate electrode and the second gate electrode according to an embodiment of the present disclosure.

FIG. 7 schematically shows a step of depositing an interlayer insulating layer and a second amorphous silicon layer on a gate insulating layer, a first gate electrode, and a second gate electrode according to an embodiment of the present disclosure, wherein 1 is a substrate, 2 is a buffer layer, 3 is a first active layer, 4 is a gate insulating layer, 51 is a first gate electrode, 52 is a second gate electrode, 6 is an interlayer insulating layer, and 61 is a second amorphous silicon layer.

The second polysilicon layer 61 is patterned to form a second active layer 7 at position corresponding to the second gate electrode 52.

Figure 8:
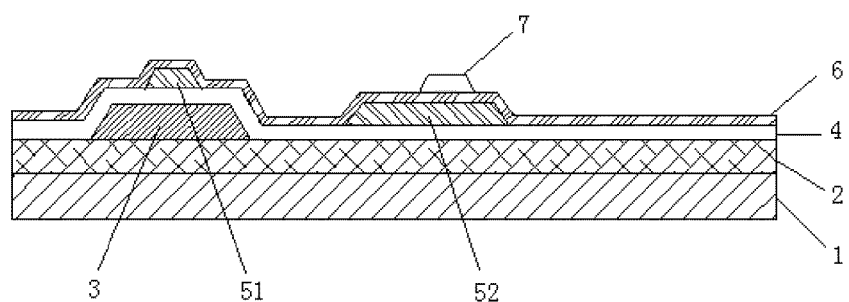
FIG. 8 schematically shows a step of forming a second active layer at position corresponding to a second gate electrode according to an embodiment of the present disclosure.

FIG. 8 schematically shows a step of forming a second active layer on a second gate electrode according to an embodiment of the present disclosure, wherein 1 is a substrate, 2 is a buffer layer, 3 is a first active layer, 4 is a gate insulation layer, 51 is a first gate electrode, 52 is a second gate electrode, 6 is an interlayer insulating layer, and 7 is a second active layer.

Specifically, solid phase crystallization is performed by using the method of rapid thermal annealing (RTA), and the method has the advantages of short time-consuming, less heat consumption, more yields and easy-to-control process. Moreover, polysilicon after crystallization has fewer defects and small internal stress. In the rapid thermal treatment process, the quantum effect has the following functions: a. increasing bulk diffusion and surface diffusion coefficient at any treatment temperature; b. shortening the time of heat treatment process; c. reducing micro-defect density, thereby improving material properties.

In step 106, a first via hole 71 and a second via hole 72 are formed in the gate insulating layer 4 and the interlayer insulating layer 6 corresponding to the first active layer 3, and a third via hole 73 is formed in the interlayer insulating layer 6 corresponding to the second gate electrode 52.

Figure 9:
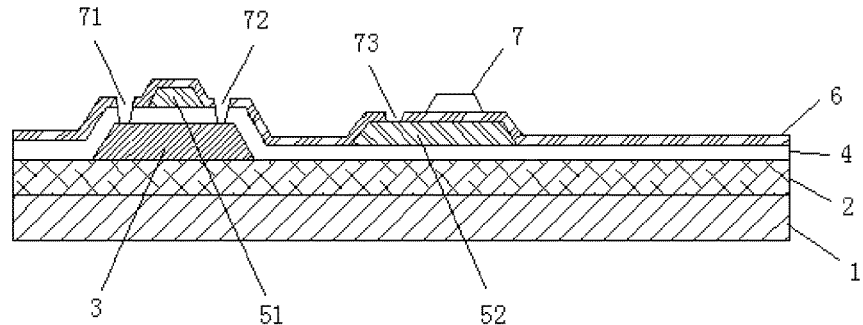
FIG. 9 schematically shows a step of forming via holes in the first active layer and the second gate electrode according to an embodiment of the present disclosure.

FIG. 9 schematically shows a step of forming via holes above the first active layer 3 and the second gate electrode 52 in an embodiment of the present disclosure, wherein 1 is a substrate, 2 is a buffer layer, 3 is a first active layer, 4 is a gate insulating layer, 51 is a first gate electrode, 52 is a second gate electrode, 6 is an interlayer insulating layer, 7 is a second active layer, 71 is a first via hole, 72 is a second via hole, and 73 is a third via hole.

In step 107 a source-drain electrode layer 8 (M2 layer) is deposited and patterned, and at the same time, a channel 74 is formed on the surface of the second active layer 7.

Figure 10:
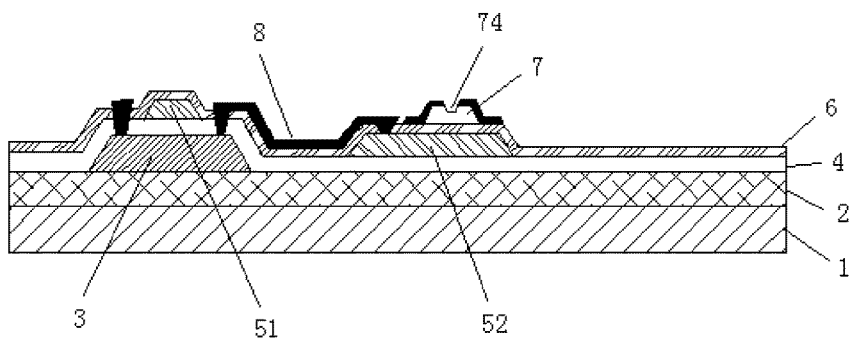
FIG. 10 schematically shows a step of depositing a source-drain electrode layer according to an embodiment of the present disclosure.

FIG. 10 schematically shows a step of depositing a source-drain electrode layer according to an embodiment of the present disclosure, wherein 1 is a substrate, 2 is a buffer layer, 3 is a first active layer, 4 is a gate insulating layer, 51 is a first gate electrode, 52 is a second gate electrode, 6 is an interlayer insulating layer, 7 is a second active layer, 74 is a channel, and 8 is a source-drain electrode layer.

In step 108, the passivation layer 9 is deposited and patterned, a flat layer 10 is deposited on the passivation layer 9, and a fourth via hole 100 is formed in the flat layer 10 at a position thereof in the display TFT region, the fourth via hole 100 extending to the surface of the source-drain electrode layer 8.

Figure 11:
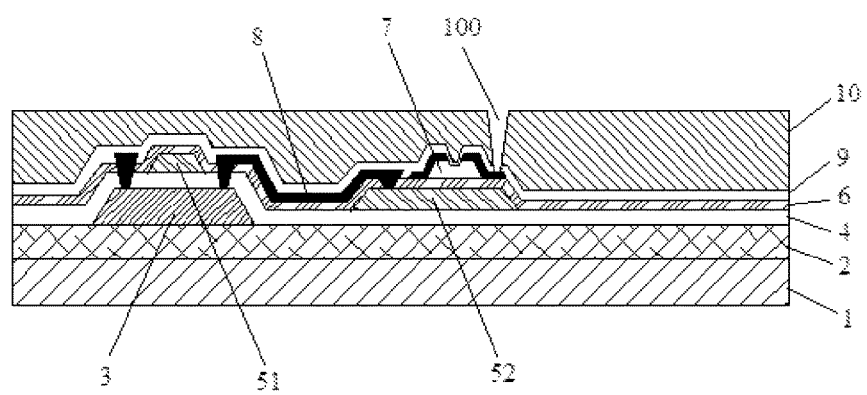
FIG. 11 schematically shows a step of depositing a passivation layer and a flat layer according to an embodiment of the present disclosure.

FIG. 11 schematically shows a step of depositing a passivation layer and a flat layer according to an embodiment of the present disclosure, wherein 1 is a substrate, 2 is a buffer layer, 3 is a first active layer, 4 is a gate insulating layer, 51 is a first gate electrode, 52 is a second gate electrode, 6 is an interlayer insulating layer, 7 is a second active layer, 8 is a source-drain electrode layer, 9 is a passivation layer, 10 is a flat layer, and 100 is a fourth via hole.

In step 109, an anode electrode 11 is deposited on the flat layer 10, the anode electrode 11 being in contact with the source-drain electrode layer via a fourth via 100, then the pixel definition layer 12 is deposited, and a pattern is defined, so that the TFT substrate is manufactured.

Figure 12:
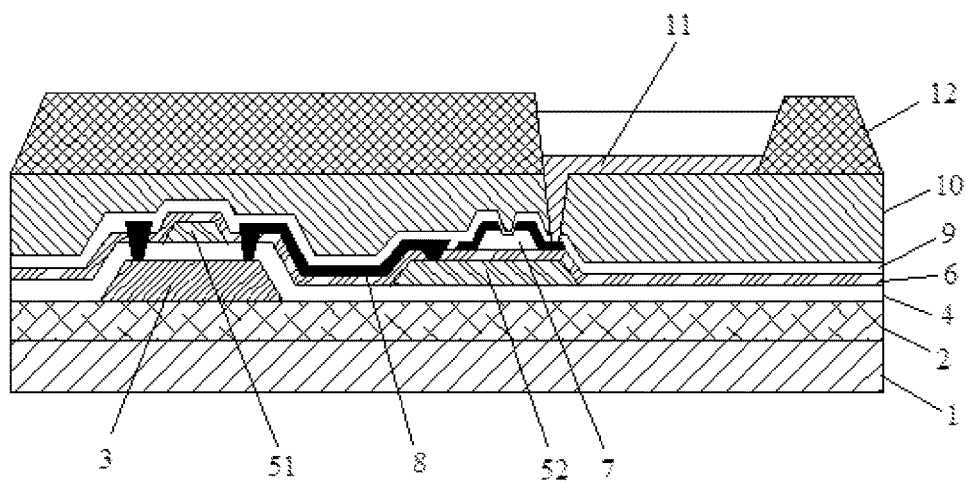
FIG. 12 schematically shows a structure of a TFT substrate manufactured according to an embodiment of the present disclosure.

FIG. 12 schematically shows a structure of a TFT substrate manufactured according to an embodiment of the present disclosure, wherein 1 is a substrate, 2 is a buffer layer, 3 is a first active layer, 4 is a gate insulating layer, 51 is a first gate electrode, 52 is a second gate electrode, 6 is an interlayer insulating layer, 7 is a second active layer, 8 is a source-drain electrode layer, 9 is a passivation layer, 10 is a flat layer, 11 is an anode electrode, and 12 is a pixel definition layer.

In the display TFT region, a short switching time and a small leakage current are needed, while in the drive TFT region, sufficient electron mobility and current output uniformity are needed so as to improve luminous uniformity thereof. According to the present disclosure, excimer laser annealing (ELA) is performed on the amorphous silicon layer of the drive TFT region so as to obtain LTPS TFT, and at the same time, solid phase crystallization (SPC) is performed on the amorphous silicon layer of the display TFT region so as to obtain SPC poly TFT. In this manner, different requirements of the display panel for the properties of TFT can be met. In the display TFT region, TFT of LTPS is used, so that its advantages of quick response and small volume can be played. In the drive TFT region, SPC poly TFT is used, so that OLED device with a constant current can be manufactured. The OLED device has a high mobility, a good reliability and a small parasitic capacitance. With the cooperation of the drive TFT region and the display TFT region, the technical problem of non-uniform picture can be solved, and power consumption thereof can be reduced. In this manner, not only the manufacturing cost can be saved, but also luminous uniformity of OLED can be improved.

Although the present disclosure is described hereinabove with reference to specific embodiments, it can be understood that, these embodiments are merely examples of the principles and applications of the present disclosure. Hence, it can be understood that, numerous modifications can be made to the embodiments, and other arrangements can be made, as long as they do not go beyond the spirit and scope of the present disclosure as defined by the appended claims. It can be understood that, different dependent claims and features described herein may be combined in a manner different from those described in the initial claims. It can also be understood that, the technical features described in one embodiment can also be used in other embodiments.

The invention claimed is:

1. A method for manufacturing a TFT substrate, comprising:
    step 101: providing a substrate and depositing a buffer layer on the substrate, wherein the substrate includes a drive TFT region and a display TFT region;
    step 102: depositing a first amorphous silicon layer on the buffer layer, and performing excimer laser annealing on the first amorphous silicon layer so as to convert the first amorphous silicon layer into a first polysilicon layer through crystallization;
    patterning the first polysilicon layer, to obtain a first active layer that is located in the drive TFT region;
    step 103: depositing a gate insulating layer on the first active layer and the buffer layer;
    depositing and patterning a first metal layer on the gate insulating layer, to form a first gate electrode at a position corresponding to position of the first active layer and form a second gate electrode at a position corresponding to position where the first active layer is not arranged;
    step 104: implanting ions into the gate insulating layer taking the first gate electrode and the second gate electrode as a shading layer;
    step 105: depositing an interlayer insulating layer on the gate insulating layer, the first gate electrode and the second gate electrode, depositing a second amorphous silicon layer on the interlayer insulating layer, implanting ions into the second amorphous silicon layer, and performing solid phase crystallization on the second amorphous silicon layer so as to convert the second amorphous silicon layer into a second polysilicon layer;
    patterning the second polysilicon layer to form a second active layer at a position corresponding to the second gate electrode;
    wherein the second amorphous silicon layer is implanted with boron (B) ions;
    step 106: forming a first via hole and a second via hole in the gate insulating layer and the interlayer insulating layer corresponding to the first active layer, and forming a third via hole in the interlayer insulating layer corresponding to the second gate electrode;
    step 107: depositing a source-drain electrode layer, patterning the source-drain electrode layer, and forming a channel on a surface of the second active layer at the same time;
    step 108: depositing a passivation layer and patterning the passivation layer, depositing a flat layer on the passivation layer, and forming a fourth via hole in the flat layer at a position thereof in the display TFT region, the fourth via hole extending to a surface of the source-drain electrode layer; and
    step 109: depositing an anode electrode on the flat layer, the anode electrode being in contact with the source-drain electrode layer through a fourth via hole, depositing a pixel definition layer, and defining a pattern, so that the TFT substrate is manufactured.

2. The method according to claim 1, wherein the substrate is a glass substrate.

3. The method according to claim 2, wherein a material of the interlayer insulating layer is silicon oxide, silicon nitride or a combination thereof.

4. The method according to claim 3, wherein a thickness of the interlayer insulating layer ranges 100 nm to 300 nm.

5. The method according to claim 2, wherein a thickness of the flat layer ranges from 100 nm to 500 nm.

6. The method according to claim 1, wherein a material of the buffer layer is silicon oxide, silicon nitride, or a combination thereof.

7. The method according to claim 6, wherein a thickness of the gate insulating layer ranges from 50 nm to 500 nm.

8. The method according to claim 1, wherein a thickness of the passivation layer ranges from 50 nm to 300 nm.

9. The method according to claim 8, wherein a thickness of the pixel definition layer ranges from 300 nm to 900 nm.

* * * * *